United States Patent [19]

Bascans et al.

[11] Patent Number: 5,347,180
[45] Date of Patent: Sep. 13, 1994

[54] THREE-INPUT SIGNAL SECTION, APPLICATION TO A SELECTOR WITH N INPUTS AND TO A POLLER WITH N INPUTS

[75] Inventors: Rémi Bascans, Toulouse; Christophe Fleury, Colomiers; Eric Autechaud, Toulouse; Christian N'Guyen, Blagnac, all of France

[73] Assignee: Societe Anonyme dite: Aerospatiale Societe Nationale Industrielle, Paris, France

[21] Appl. No.: 919,139

[22] Filed: Jul. 23, 1992

[30] Foreign Application Priority Data

Aug. 2, 1991 [FR] France ................. 91 09879

[51] Int. Cl.⁵ .................... H03K 19/23; H03K 19/003
[52] U.S. Cl. ......................... 307/464; 307/443
[58] Field of Search ............. 307/464, 470, 443, 441

[56] References Cited

U.S. PATENT DOCUMENTS

| | | | |
|---|---|---|---|
| 4,593,249 | 6/1986 | Arita et al. | 307/443 |
| 4,617,475 | 10/1986 | Reinschmidt | 307/464 |
| 4,748,594 | 5/1988 | Iida | 307/464 |

FOREIGN PATENT DOCUMENTS 2086455 12/1971 France .

OTHER PUBLICATIONS

ISA Transactions, vol. 29, No. 2, Feb. 1, 1990, Pittsburgh, Pa., U.S.A., pp. 13–16, "Fault tolerant programmable controllers for safety systems."

*Primary Examiner*—Edward P. Westin
*Assistant Examiner*—Jon Santamauro
*Attorney, Agent, or Firm*—Marshall, O'Toole, Gerstein, Murray & Borun

[57] ABSTRACT

A three-input signal selector formulates two output signals from three input signals. The selector is useful in pollers of various types.

12 Claims, 9 Drawing Sheets

| $E_s1$ | $E_s2$ | $E_s3$ | M1 | M2 | AIG1 | AIG2 | $S_s1$ | $S_s2$ |
|---|---|---|---|---|---|---|---|---|
| C | C | C | H | H | ACT | ACT | $E_s2$ | $E_s2$ |
| I | C | C | B | H | ACT | REP | $E_s2$ | $E_s3$ |
| C | I | C | B | B | REP | REP | $E_s1$ | $E_s3$ |
| C | C | I | H | B | REP | ACT | $E_s1$ | $E_s2$ |
| I | I | C | B | B | REP | REP | $E_s1$ | $E_s3$ |
| I | C | I | B | B | REP | REP | $E_s1$ | $E_s3$ |
| C | I | I | B | B | REP | REP | $E_s1$ | $E_s3$ |
| I | I | I | B | B | REP | REP | $E_s1$ | $E_s3$ |

| $E_s1$ | $E_s2$ | $E_s3$ | M1 | M2 | AIG1 | AIG2 | $S_s1$ | $S_s2$ | M1 | INT 1 | $S_s$ |
|---|---|---|---|---|---|---|---|---|---|---|---|
| C | C | C | H | H | ACT | ACT | $E_s2$ | $E_s2$ | H | ACT | $E_s2$ |
| I | C | C | B | H | ACT | REP | $E_s2$ | $E_s3$ | H | ACT | $E_s2$ |
| C | I | C | B | B | REP | REP | $E_s1$ | $E_s3$ | H | ACT | $E_s1$ |
| C | C | I | H | B | REP | ACT | $E_s1$ | $E_s2$ | H | ACT | $E_s1$ |
| I | I | C | B | B | REP | REP | $E_s1$ | $E_s3$ | B | REP | Z |
| I | C | I | B | B | REP | REP | $E_s1$ | $E_s3$ | B | REP | Z |
| C | I | I | B | B | REP | REP | $E_s1$ | $E_s3$ | B | REP | Z |
| I | I | I | B | B | REP | REP | $E_s1$ | $E_s3$ | B | REP | Z |

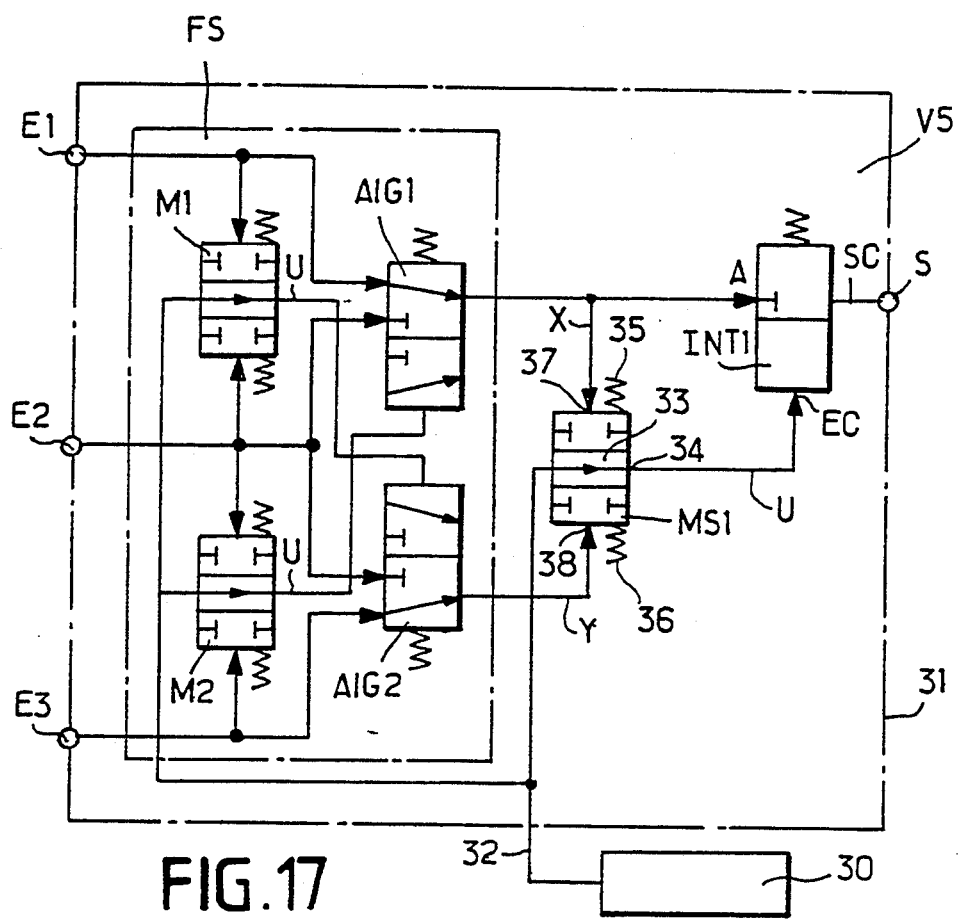
FIG.17
FIG.18
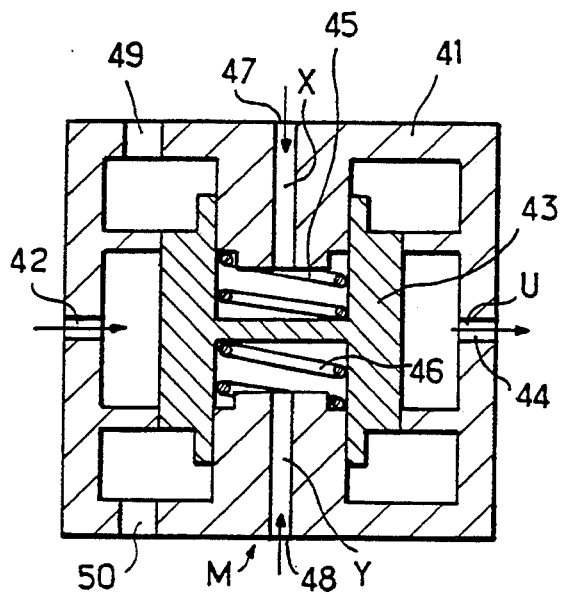
FIG.19
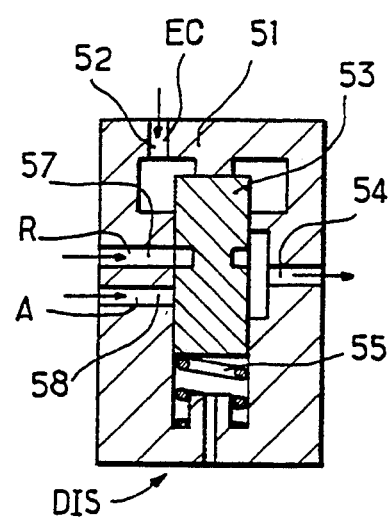

THREE-INPUT SIGNAL SECTION, APPLICATION TO A SELECTOR WITH N INPUTS AND TO A POLLER WITH N INPUTS

The present invention relates to a three-input signal selector, its extension to n inputs and its applications, in particular to the construction of pollers.

It is known that signal selectors are devices, hardware and/or software which, on receiving a plurality of (generally at least equal to three) of independent input signals arising from sub-systems used redundantly, which signals are representative of the same quantity, deliver a lesser number of output signals, the signals discerned as being incorrect not appearing at output.

Similarly, a poller ensures such a selection and transmits only a single signal, resulting from a specific poll. For example, in the case of three input signals:
- the poll is majority and the output signal is the value of two identical input signals; or
- the poll relates to the median and the output signal consists of the input signal which is flanked by the other two; or
- the poll is adaptive, the input signal furthest from the other two being rejected and the output signal being the average of the two remaining input signals; etc.

The role of a three-input poller is to ensure at its output a correct signal from the three input signals, that is to say to tolerate a fault in one of its three input signals, which poses, by its very principle, two problems:
- when two input signals are faulty, in neighboring states, the poll favors the two incorrect input signals, since they are majority, and this undesired operation is not seen by the system. The pollers permitting detection of the existence of a second faulty input require an additional mechanism which makes the whole more complex;
- the single output represents the critical point of a triplex architecture (system composed of three sub-systems fulfilling the same function so as to provide, to a three-input poller, three signals which are independent but representative of the same quantity), since, when a fault shows up at the output of the poller, service can no longer be rendered or, worse, may be incorrect. Stated otherwise, a poller is not tolerant of its own faults, which entails the risk of losing correct service upon a simple fault at poller level.

According to the type of poller implemented, other difficulties may be encountered:
- need for strict synchronization of the three input signals relative to one another in order to perform the poll;
- problem of processing correct but non-identical input signals, owing to the tolerances of each subsystem formulating said input signals;
- problem of rate of detection of improper operation (ratio between detected and undetected faults) on the basis of three signals, which is more complex and less deterministic than for duplex architectures (system composed of two sub-systems fulfilling the same function so as to provide, to an appropriate mechanism, two signals which are independent but representative of the same quantity) where detection of improper operation of the system is a simple comparison of two signals;
- problem of some pollers which mask the errors without locating the faulty input, whence the inability to inform the system as regards the identity of the faulty sub-system.

Software pollers make it possible to set in place an evolutive poll, but at the cost of not insignificant computation time, which may be incapable of exploitation in respect of fast systems. In addition, this evolutive poll involves substantial software which requires substantial validation work.

The aim of the present invention is to alleviate these disadvantages. It makes it possible, through the implementation of simple means, to increase both operational reliability and security. It relates, moreover, to all signal types, be they electrical, optical, pneumatic, or other, analog or digital, serial or parallel. It is suitable for conferring upon a system the continuity of a correct service onto independent outputs or on a single output, depending on its application, when one of its sub-systems is faulty and for isolating the output of the poller when the latter is no longer in a position to ensure correct service.

To this end, according to the invention, the signal selector comprising a first, a second and a third input which are able to receive respectively a first, a second and a third signal and comprising a first and a second output, is notable in that it comprises:
- a first two-channel diverter provided with an active input, with a quiescent input, and with a control input which is able to receive a control signal which sets, depending on its state, said diverter to an active state or to a quiescent state, and with a common output, said quiescent input and said active input of said first diverter being respectively connected to said first and second inputs of said selector, whereas said common output of said first diverter is connected to said first output of the selector, this common output transmitting the signal applied to the active input when said first diverter is in the active state, and transmitting the signal applied to the quiescent input when said first diverter is in the quiescent state;
- a second two-channel diverter provided with an active input, with a quiescent input, and with a control input which is able to receive a control signal which sets, depending on its state, said diverter to an active state or to a quiescent state, and with a common output, said active input and said quiescent input of said second diverter being respectively connected to said second and third inputs of said selector, whereas said common output of said second diverter is connected to said second output of the selector, this common output transmitting the signal applied to the active input when said diverter is in the active state, and transmitting the signal applied to the quiescent input when said diverter is in the quiescent state;
- a first monitor with two inputs, connected respectively to said first and second inputs of said signal selector, which is able to measure the deviation between said first and second signals and whose output is connected to the control input of said second diverter and is able to control the state of this second diverter; and
- a second monitor with two inputs, connected respectively to said second and third inputs of said signal selector, which is able to measure the deviation between said second and third signals and whose output is connected to the control input of said first diverter and is able to control the state of this first diverter.

Thus, said selector automatically configures three input signals into two output signals. These two output signals are both representative of the signal applied to said second input, when none of the signals applied to the three inputs is faulty, and they are supervised by two independent monitors. In the event that one of the three input signals is faulty, the faulty input signal is isolated and the two output signals are representative of the other two input signals, this being favorable to operational reliability. These two outputs of said selector are therefore tolerant to a fault, through the fact that the two output signals are independent of an input signal. These two output signals can be monitored with respect to one another or they can be exploited by means of two distinct systems, as for duplex architectures, which is favorable to security.

The monitors and diverters can have any appropriate structure.

An electrical embodiment, given by way of example for analog or digital, serial or parallel signals, is notable in that each of said monitors comprises:

differentiator means for measuring the difference between the signals applied to the inputs of said monitor;

comparator means for comparing said difference with a predetermined threshold and for generating an error signal if the absolute value of said difference is greater than the absolute value of said threshold.

Thus, said monitor delivers an output signal intended to control, in a given state, the associated two-channel diverter, not only when the two signals applied to its inputs are identical, but even when the latter signals are slightly different (owing to a shift in amplitude and/or in phase), said threshold making it possible to tolerate acceptable amplitude differences, whereas too large a difference between the input signals causes an error signal (that is to say a change of state of the output signal) which serves to change the state of a diverter so as to suppress transmission of the incorrect signal.

Advantageously, in order to mask the effect of transient defects, delay timer means are interposed in series with the output of the monitor.

Each two-channel diverter may be of the electric switch or electric switching device type consisting of one or more identical switching elements arranged in parallel.

In the case where the input signals are optical, each two-channel diverter can be of the optical multiplexer type with electric control or optical switching device with electric control consisting of several identical optical switching elements, with electric control, arranged in parallel.

If the input signals are pneumatic or hydraulic, each two-channel diverter is advantageously of the hydraulic or pneumatic switch or hydraulic or pneumatic switch type consisting of several identical switching elements arranged in parallel. Each of the monitors may comprise a member subject to the opposing action of the signals appearing in the signal inputs of said monitor and controlling the passage of fluid between a pressure source and the output of said monitor. Similarly, each of said diverters can comprise a member, subject to the action of the signal applied to the control input of said diverter, said member being able to place one or the other of two signal input orifices in communication with an output orifice.

According to a variant, said signal selector is notable in that:

the first diverter and second diverter comprise respectively, additionally, a state output providing a signal representative of the active or quiescent state of said diverter;

and in that it comprises:

a detector means with two inputs, connected respectively to the state output of the first diverter and second diverter, which is able to provide, on its output, an item of information indicative of the presence of one at Least of the first diverter and second diverter in the quiescent state;

a first interlock means, interposed between the output of said first monitor and the control input of said second diverter, receiving, on a control input, said item of information arising from the output of the detector means and enabling said first monitor to control the state of said second diverter if said detector means has not previously detected that at least one of said first and second diverters is in its quiescent state, and, in the other case, preventing said first monitor from controlling said second diverter;

a second interlock means, interposed between the output of said second monitor and the control input of said first diverter, receiving, on a control input, said item of information arising from the output of the detector means and enabling said second monitor to control the state of said first diverter if said detector means has not previously detected that at least one of said first and second diverters is in its quiescent state, and, in the other case, preventing said second monitor from controlling said first diverter.

It is seen that the signal selector according to the present invention constitutes in itself a three-input, two-output selector. It can therefore serve as intermediate stage between a triplex system and a duplex system. Moreover, the two output signals of the selector can be processed in any known manner, for example with the aid of a switching logic unit, so as to obtain a single output signal, or even with the aid of a second stage which compares the two output signals in order to detect a second fault so as to isolate the output(s) of the selector. It is even possible to supplement the selector with blocking-hold logic unit, as explained above, which blocks it in its switched state after detecting a first error in the input signals so as to preclude a second error, intervening subsequently, for which the two incorrect signals would be identical, from causing the selector to react to the two faulty signals as if they were correct signals, that is to say selecting them to the detriment of the one which is correct. In other words, the signal selector according to the present invention can be the subject of numerous applications, with or without the addition of additional elements.

According to one application of said three-input signal selector, a signal selector is made having a plurality of n inputs (where n is an integer $\geq 3$) and two outputs, comprising a plurality of n-2 signal selectors with three inputs, which is notable in that said three-input signal selectors are respectively mounted in cascade, the three inputs of the first three-input signal selector being respectively connected to three of said n inputs, whereas, for each of the n-3 other three-input signal selectors of rank i (where 1<i≦n-2), two of its inputs are connected respectively to the outputs of the upstream three-input signal selector of rank i-1, the third of said inputs of the three-input signal selector of rank i being connected inherently to one of said n inputs of said signal selector with n inputs, whereas the outputs of that signal selector which is furthest downstream are connected respectively to the outputs of said signal selector with n inputs.

Thus, said n-2 signal selector(s) consisting of said first and second two-channel diverters and of said first and second monitors, form(s) a selector with n inputs which automatically configures the n input signals into two output signals, isolating any possible faulty input signals. This makes it possible to tolerate a fault in n-2 input signals, and thus ensure, through the choice of a sufficient number n of inputs, good reliability for the provision of correct output signals.

Said signal selector with n inputs can serve to constitute a poller with n inputs and one output, comprising said signal selector with n inputs, which is notable in that it comprises:

a first interrupter provided with an active input and with a control input which is able to place, or not, said active input in connection with a common output, depending on whether this first interrupter is respectively in the active state or in the quiescent state, as a function of the signal applied to said control input, said active input and said common output of said first interrupter being respectively connected to one of said outputs of the signal selector with n inputs and to the output of said poller with n inputs; and a first output monitor with two inputs which are respectively connected to said outputs of said signal selector with n inputs and are able to measure the deviation between the signals appearing on said outputs of the signal selector with n inputs, and whose output is connected to the control input of said first interrupter and is able to control the state of said first interrupter.

Thus, said signal selector with n inputs forms a first stage which automatically configures the n input signals into two intermediate signals, isolating any possible faulty input signals, whereas said first output monitor and said first interrupter form a second stage which compares these two intermediate signals generated by the first stage in order to detect a fault at this level, so as to isolate the output of the poller if there is a disagreement between said intermediate signals. Security is thus increased. Upstream of the first stage of the poller there is a redundant at-least-triplex structure of sub-systems making it possible to increase the operational reliability of the whole, whereas downstream of this first stage is arranged a second stage making it possible to monitor the coherence of the two output signals of the first stage.

The mechanisms implemented are of the same type as those used for duplex structures (the simplest to construct), which makes it possible to obtain good detection of improper operation of the system and in as deterministic a manner as the duplex architectures (simple comparison of the two independent quantities whose result is "yes" or "no"). These mechanisms are completely independent of one another (no common point), so that a fault in one of them cannot cause a fault in the others, which makes it possible to tolerate a fault at the level of the first stage of one of them (service is still ensured) whilst conforming to the security criterion since the invention ensures, in all the illustrative cases, double supervision.

Moreover, the invention makes it possible to obtain better security than duplex systems (whose objective is security), since, in the most unfavorable case in respect of a duplex structure, there is a risk of generating an incorrect output in the event of two faults, whereas, for the poller associated with a triplex structure, still in the most unfavorable case, three faults are necessary to generate an incorrect output (the first fault is tolerated by the first stage, which amounts to a duplex structure and, as before, two other faults are then necessary for there to be a risk of an incorrect output). Moreover, with said poller in degraded mode (duplex structure), there is always the same rate of detection of improper operation, which makes it possible to ensure the same level of security as the duplex structures.

The principle of operation of the invention is simple and suited to all types of signals: optical, electrical or other. However, construction of the poller, in particular the monitors, depends:

on the type of input signals;
on the constraints related to the interactions with the environment (asynchronous operation, fault detection mechanism, desired guaranteed response time, etc.).

Depending on the application, there therefore results a number of embodiments of which only a few are described in the present description.

Moreover, the system according to the invention has the possibility of knowing the identity of the faulty sub-system by analyzing the configuration of the poller, and thus the system can diagnose (in terms of nature and locality) its fault so as to act accordingly.

So as to improve further the reliability of said poller, it may comprise:

m interrupters, said active input and common output of each of said m interrupters being connected respectively to one of said outputs of said signal selector with n inputs and to the output of said poller with n inputs; and m output monitors with two inputs, one of the two inputs of which is connected to one of the outputs of said signal selector with n inputs and the other of the two inputs of which is connected to the other of the outputs of said signal selector with n inputs, which are able to measure the deviation between the signals appearing on said outputs of said signal selector with n inputs, and whose output is connected inherently to the control input of one of said m interrupters, of like rank j, and is able to control the state of said interrupter.

Thus, said second stage can include several interrupter-output monitor assemblies in parallel, constituting a redundant structure making it possible to mask interrupter transitions to the quiescent state, due to faults.

Of course, said output monitors can be similar to said first and second monitors, whereas the interrupters may be of a simpler type than the diverters since they have no quiescent input.

The figures of the attached drawing will give a better understanding of how the invention can be constructed. In these figures, identical references denote similar elements.

FIG. 1 gives the block diagram of the three-input signal selector according to the present invention.

FIG. 2 is the truth table of the three-input signal selector of FIG. 1.

FIG. 3 gives the block diagram of an illustrative embodiment of a monitor, used in said selector, with a threshold.

Figure 7:
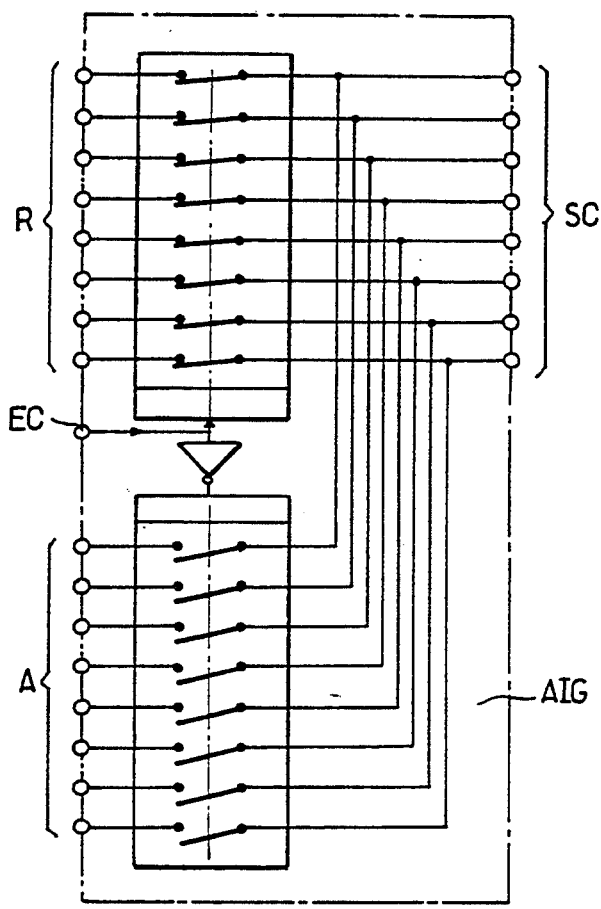

FIG. 7 gives the block diagram of an illustrative embodiment of a switch with several parallel channels.

Figure 8:
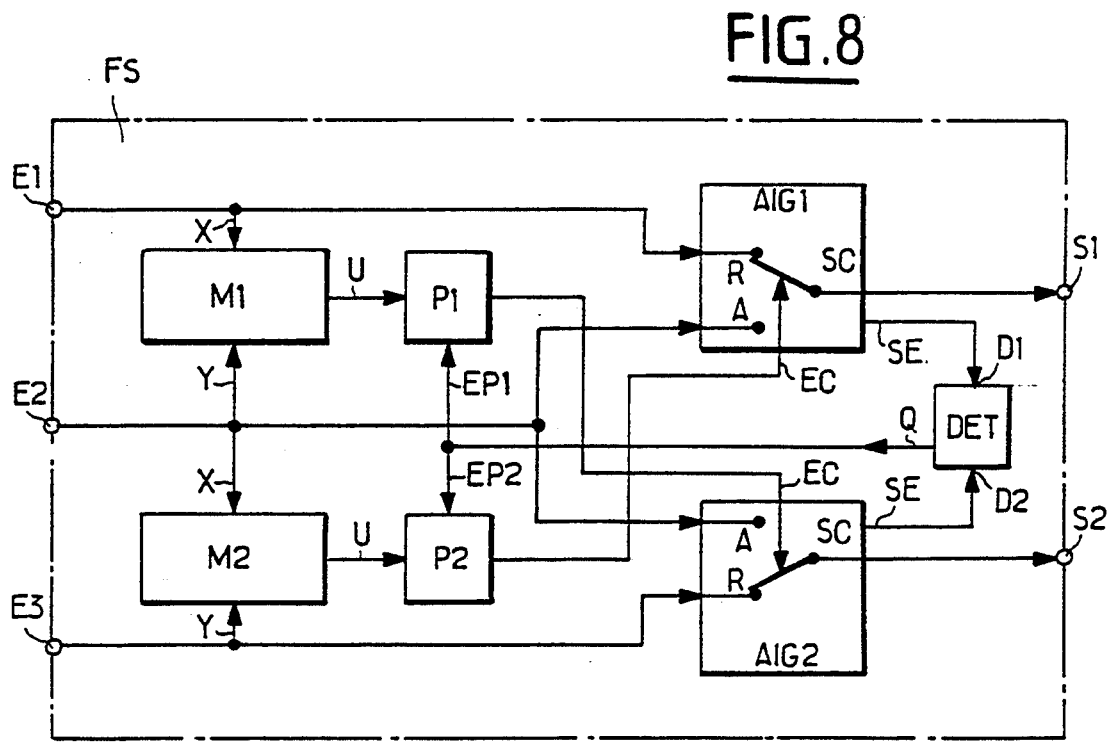

FIG. 8 represents diagrammatically a three-input signal selector having a blocking operation memorizing the configuration after a first defect.

Figure 9:
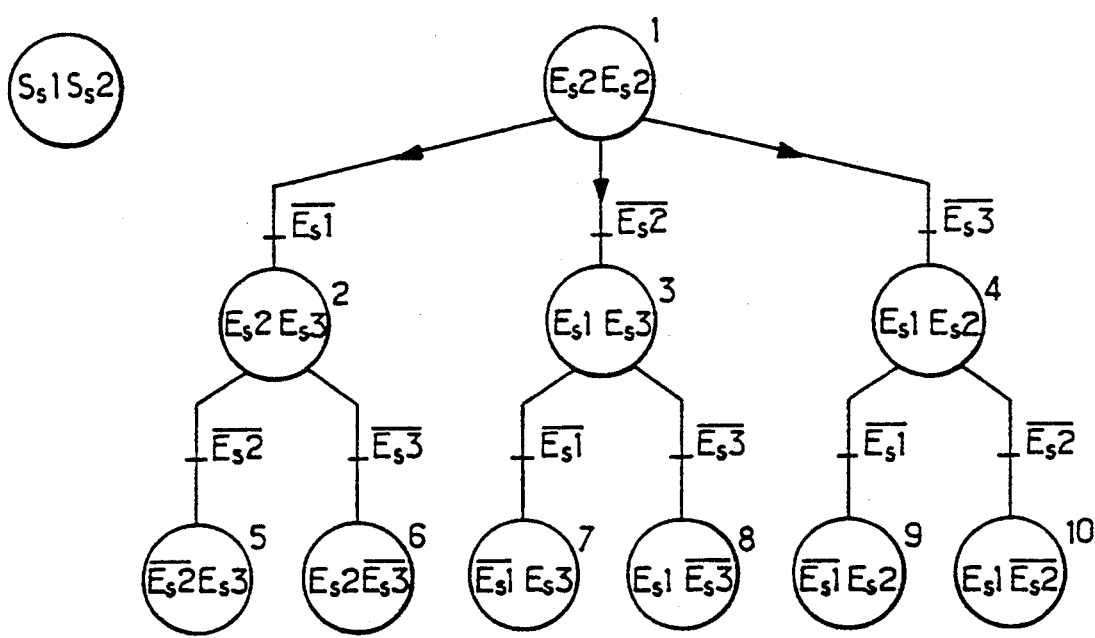

FIG. 9 is a transition chart illustrating the operation of the blocking selector shown in FIG. 8.

Figure 10:
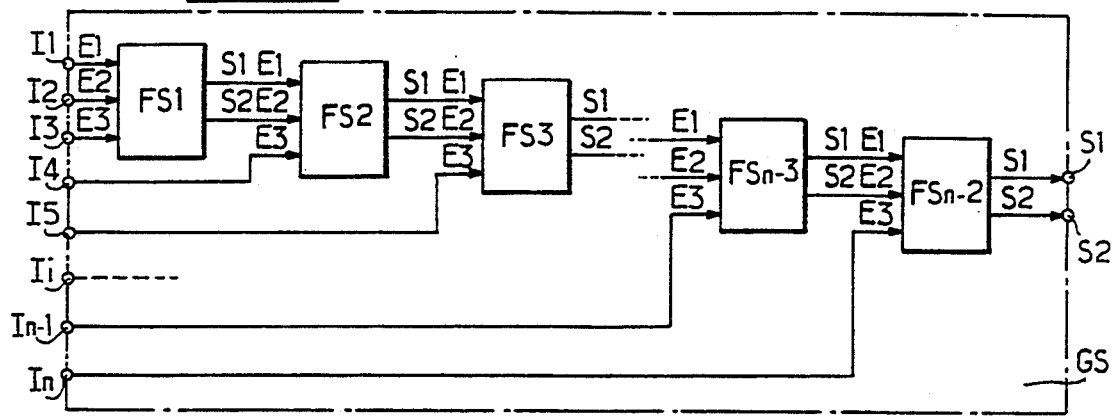

FIG. 10 shows diagrammatically a signal selector with n inputs, constructed by a cascade of three-input signal selectors according to the invention.

Figure 11:
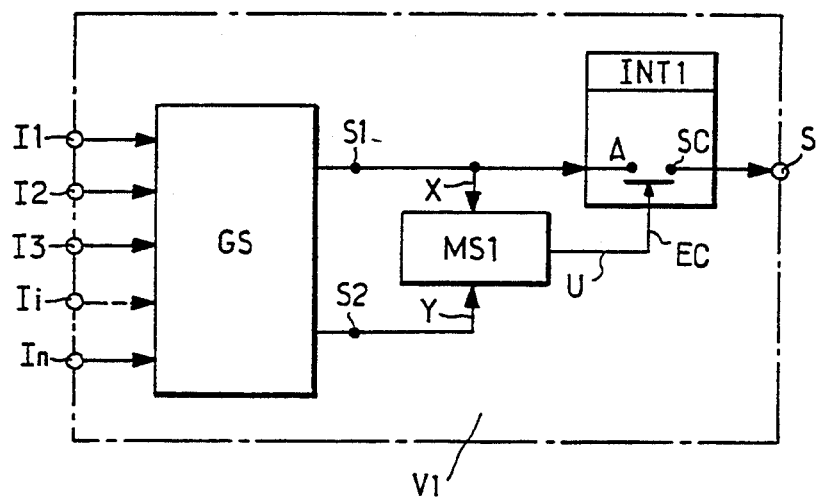

FIG. 11 illustrates diagrammatically the application of a selector with n inputs to the construction of a poller with n inputs.

Figure 12:
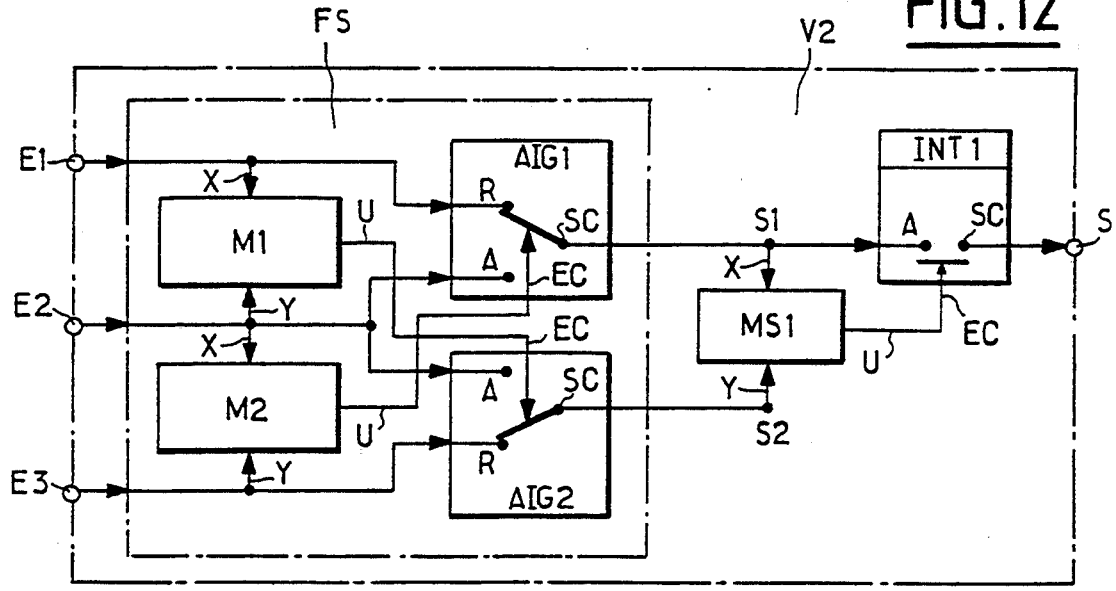

FIG. 12 shows such a poller with three inputs.

Figures 13, 14:
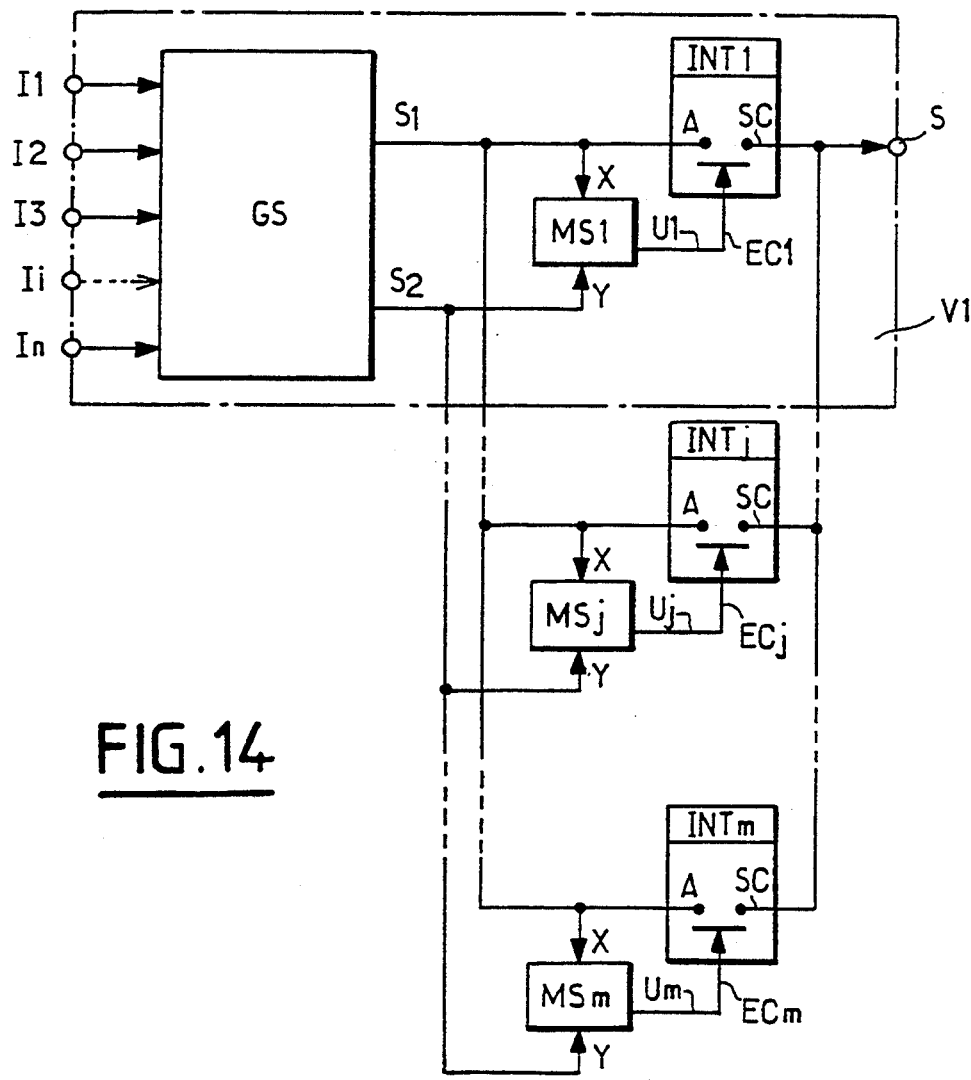

FIG. 13 is a truth table of the poller shown in FIG. 12.

FIG. 14 illustrates a poller redundant at output.

Figure 15:
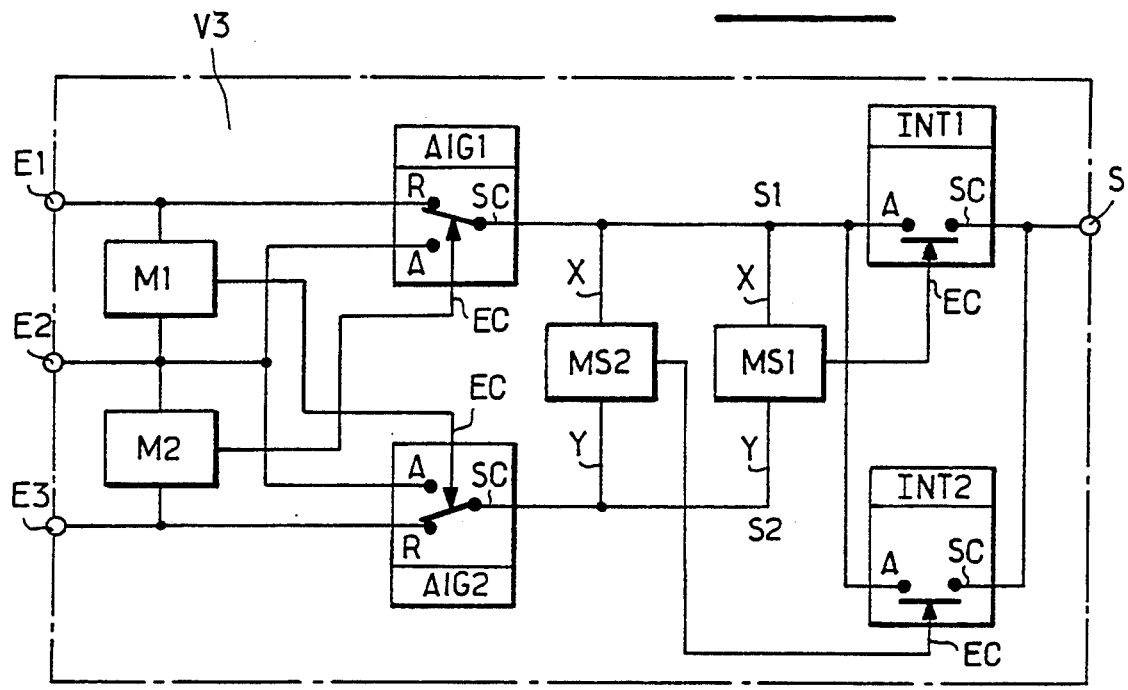

FIG. 15 illustrates a three-input poller, as illustrated in FIG. 14, with a redundancy of order 2 at output.

Figure 16:
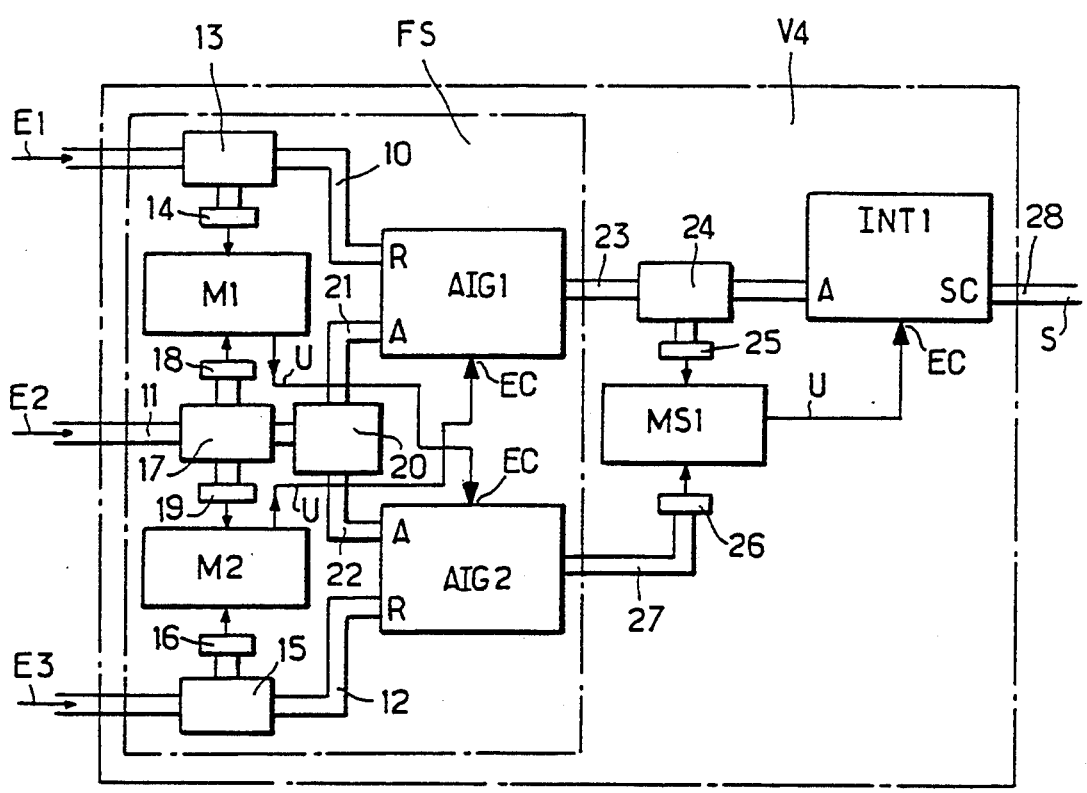

FIG. 16 illustrates the construction, with electro-optical technology, of the poller of FIG. 11.

FIG. 17 illustrates the embodiment, with hydraulic or pneumatic technology, of the poller of FIG. 11.

FIGS. 18 and 19 show diagrammatically the pneumatic or hydraulic construction of a monitor and of a two-channel diverter, respectively, according to the invention.

Figures 1, 2:
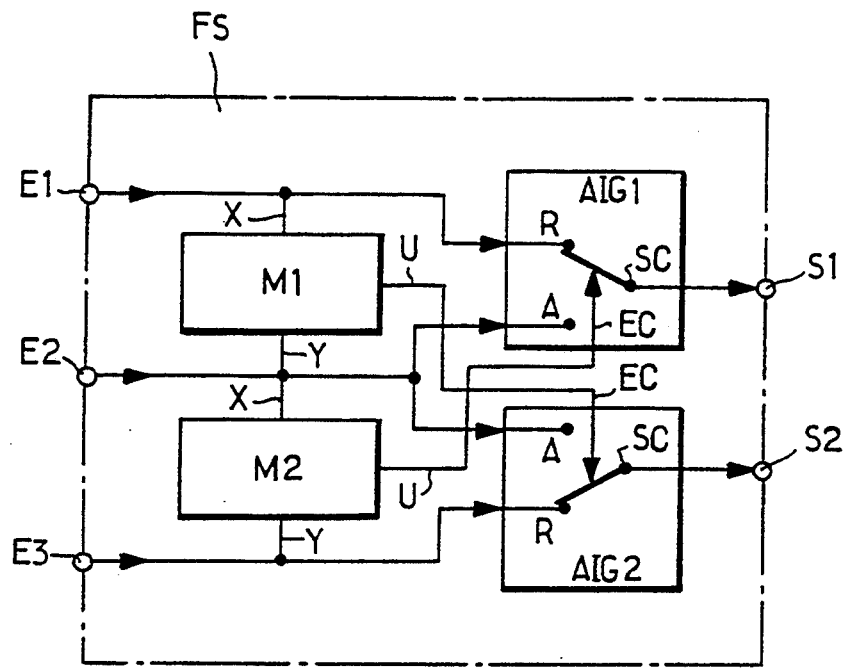

The signal selector FS according to the present invention and shown by FIG. 1 is provided with a first input E1, with a second input E2 and with a third input E3, as well as with a first output S1 and with a second output S2. It comprises:

a first two-channel diverter AIG1 provided with an active input A, with a quiescent input R, and with a control input EC, which first diverter transmits, to a common output SC, the signal applied to the active input A or to the quiescent input R, according to whether this first diverter AIG1 is in the active state ACT or the quiescent state REP respectively, as a function of the signal received on said control input EC. Said quiescent input R and said active input A of said first diverter AIG1 are respectively connected to the first input E1 and second input E2 of the signal selector FS, whereas said common output SC is connected to the first output S1 of this signal selector FS;

a second two-channel diverter AIG2, of similar construction to the first diverter AIG1, the active input A and the quiescent input R of said second diverter AIG2 being respectively connected to the second input E2 and to the third input E3 of the signal selector FS, whereas its common output SC is connected to the second output S2 of this signal selector FS;

a first monitor M1 with two inputs X, Y connected respectively to said first and second inputs E1 and E2 and whose output U is connected to the control input EC of the second diverter AIG2 and is able to control the state of said second diverter AIG2; and a second monitor M2 with two inputs X, Y connected respectively to said second and third inputs E2 and E3 and whose output U is connected to the control input EC of the first diverter AIG1 and is able to control the state of said first diverter AIG1.

The signal $U_s$ and the output U of each of the two monitors M1 and M2 can take one of two possible states, according to whether this monitor M1 or M2 has or has not detected a discordance between the input signals $X_s$ and $Y_s$ applied to its two inputs X and Y respectively. These two possible states can appear in the form of any quantities, as a function of the construction of these monitors M1 and M2, for example an electrical high or low level constant signal, or a digital control value, or even the presence or absence of a pressure or any other quantity. With the aim of clarity, one of these states, at the output U of the monitors M1 and M2, is designated the low state B, and the other state is designated the high state H. As explained above, such a designation does not prejudice the manner in which these states are physically conveyed and in particular the relative magnitude between the two signals conveying these states. The output U is in the low state B when the two signals $X_s$ and $Y_s$ received on said inputs X and Y are different, and is in the high state H when the monitor M1 or M2 receives identical signals $X_s$ and $Y_s$ on its two inputs X and Y. In the present description, signals $X_s$ and $Y_s$ whose deviation is outside an accepted tolerance region are regarded as "different", and signals $X_s$ and $Y_s$ whose deviation is within said tolerance region are regarded as "identical". It should be noted that the tolerance region can be null and, in this case, monitoring is the verification of strict equality.

A monitor M1 or M2 controls respectively the diverter AIG2 or AIG1 which it monitors, in the active state ACT, when it provides it with a high state H, and in the quiescent state R, when it provides it with a low state B, on the control input EC.

In the absence of a power source supplying the selector FS, the diverters AIG1 and AIG2 are in the quiescent state REP.

The operation of the selector FS of FIG. 1 is described below, with regard to the truth table of FIG. 2: the output U of the monitor M1 or M2 is in the low state B when the two signals $X_s$ and $Y_s$ on its inputs X and Y are different, and in the high state H when these two signals are identical. In this truth table, $E_s1$, $E_s2$ and $E_s3$ denote each of the three input signals applied to the inputs E1, E2 and E3 respectively. Similarly, $S_s1$ and $S_s2$ denote the output signals appearing at the outputs S1 and S2 respectively of said signal selector FS. The following configurations may be obtained:

1) The selector FS is not supplied by a power source. In this case, the diverters AIG1 and AIG2 are in the quiescent state REP, this situation being the one represented in FIG. 1;

2) The three signals $E_s1$, $E_s2$ and $E_s3$ are correct, this being indicated by the letter C in the truth table of FIG. 2. In this case, the monitors M1 and M2 respectively detect the identity of the signals $E_s1$ and $E_s2$ and that of the signals $E_s2$ and $E_s3$ and their outputs U are in the high state H and control the diverters AIG1 and AIG2 in the active state ACT. It follows that, on the common outputs SC of the diverters AIG1 and AIG2, output signals $S_s1$ and $S_s2$ appear respectively which are identical to one another and equal to the signal $E_s2$;

3) The signal $E_s1$ is incorrect, this being indicated by the letter I in the table of FIG. 2, whereas the signals $E_s2$ and $E_s3$ are correct. The monitor M1, noting the difference in the signals $E_s1$ and $E_s2$, has a low state B at output which forces the diverter AIG2 to be in the quiescent state REP, so that the signal $S_s2$ is equal to the signal $E_s3$. Furthermore, the monitor M2, noting the identity of the signals $E_s2$ and $E_s3$, is in the high state H at output and sends the diverter AIG1 to its active state ACT. The signal $S_s1$ is therefore equal to the signal $E_s2$;

4) If now the signals $E_s1$ and $E_s3$ are correct, but the signal $E_s2$ is incorrect, the outputs U of the monitors M1 and M2 are then in the low state B and the diverters AIG1 and AIG2 are in the quiescent state REP; the signals $S_s1$ and $S_s2$ are then equal to the signals $E_s1$ and $E_s3$ respectively;

5) Similarly, if the signals $E_s1$ and $E_s2$ are correct, but the signal $E_s3$ is incorrect, the outputs U of the monitors M1 and M2 are respectively in the high state H and in the low state B and the diverters AIG1 and AIG2 are respectively in the quiescent state REP and in the active state ACT, so that the signals $S_s1$ and $S_s2$ are respectively equal to the signals $E_s1$ and $E_s2$;

6) If two of the signals $E_s1$, $E_s2$, $E_s3$ are incorrect and different, just one of them being correct, the outlets U of the monitors M1 and M2 are in the low state B and the diverters AIG1 and AIG2 are in the quiescent state REP, so that the signals $S_s1$ and $S_s2$ are respectively equal to the different signals $E_s1$ and $E_s3$; the particular case where the two incorrect signals are identical is dealt with further on;

7) Finally, if the three signals $E_s1$, $E_s2$, $E_s3$ are incorrect, the signals $S_s1$ and $S_s2$ are respectively equal to the incorrect signals, and in the general case different signals, $E_s1$ and $E_s3$.

It will be observed that when one of the three signals $E_s1$, $E_s2$ or $E_s3$ is incorrect (lines 2, 3 and 4 of FIG. 2), the state of the outputs U of the monitors M1 and M2 and the state of the diverters AIG1 and AIG2 is representative of the identity of the input transmitting an incorrect signal. Indeed:

1) If the outputs U of the monitors M1 and M2 are respectively in the low state B and in the high state H, or else if the diverters AIG1 and AIG2 are respectively in the active state ACT and quiescent state REP, it is the signal $E_s1$ which is incorrect;

2) If the outputs U of the monitors M1 and M2 are both in the low state B, or else if the diverters AIG1 and AIG2 are both in the quiescent state REP, it is the signal $E_s2$ which is incorrect;

3) Finally, if the outputs U of the monitors M1 and M2 are respectively in the high state H and in the low state B, or else if the diverters AIG1 and AIG2 are respectively in the quiescent state REP or active state ACT, it is the signal $E_s3$ which is incorrect.

Thus, it is possible, by supervising the state of the monitors M1 and M2 and/or the state of the diverters AIG1 and AIG2, to know the identity of the incorrect input signal $E_s1$, $E_s2$, $E_s3$ and therefore to identify the sub-system whose output, connected to one of the inputs E1, E2, E3 of the signal selector FS, is incorrect.

Furthermore, it will be observed that the signal selector FS formed by the monitor-diverter pairs M1, AIG2 and M2, AIG1 is tolerant to its own fault (that of one of the two pairs) in the sense in which one of the signals $E_s1$, $E_s2$, $E_s3$ is retained on each output S1, S2. Indeed, if a monitor M1, M2 of a diverter AIG1, AIG2 is the source of a failure, the diverters either being in the active state ACT or in the quiescent state REP, the electrical continuity still ensures the presence, on each of the outputs S1 and S2, of one of the three input signals $E_s1$, $E_s2$, $E_s3$.

Figure 3:
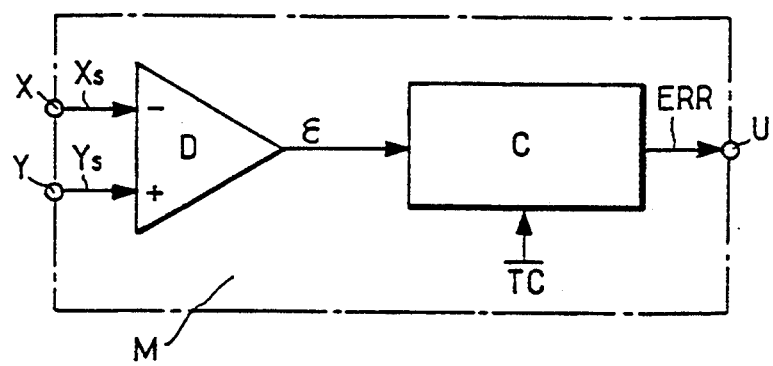

The monitors M can, moreover, include, at output, a threshold comparator. FIG. 3 shows the basic diagram of such a monitor M, able to process analog or digital signals. A differentiator means D receives respectively, on the two inputs X and Y, two signals $X_s$ and $Y_s$ to be compared, and provides, at output, a signal $\epsilon$ proportional to the difference of these two signals. This signal $\epsilon$ is applied to a first input of a threshold comparator C, receiving, on a second input, a predetermined threshold value (TC), and providing, at output U, a signal ERR indicative of the fact that the signal $\epsilon$ has greater amplitude than the threshold.

The comparison of the signals $X_s$ and $Y_s$ applied to the inputs X and Y of the monitors M is carried out by analog and/or digital circuits or by software, depending on the desired applications.

Figure 4:
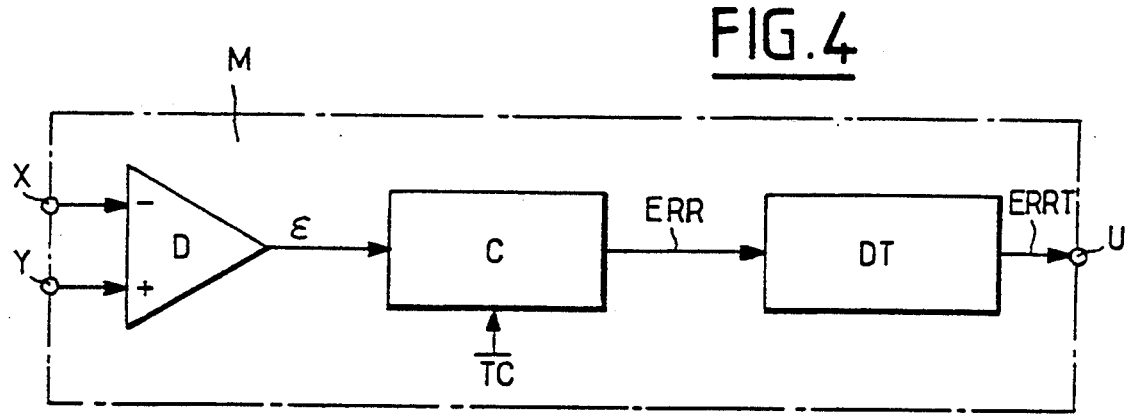
FIG. 4 shows the block diagram of a variant, including additionally a delay timer, of the monitor represented in FIG. 3.

The output of the threshold comparator C can, moreover, be connected to the input of a delay timer DT, such as represented in FIG. 4, whose output U provides a delayed error signal ERRT after the output from the comparator C has been at the low level, indicative of a discordance between the input signals $X_s$ and $Y_s$, for at least a predetermined duration $T_s$.

Figure 5:
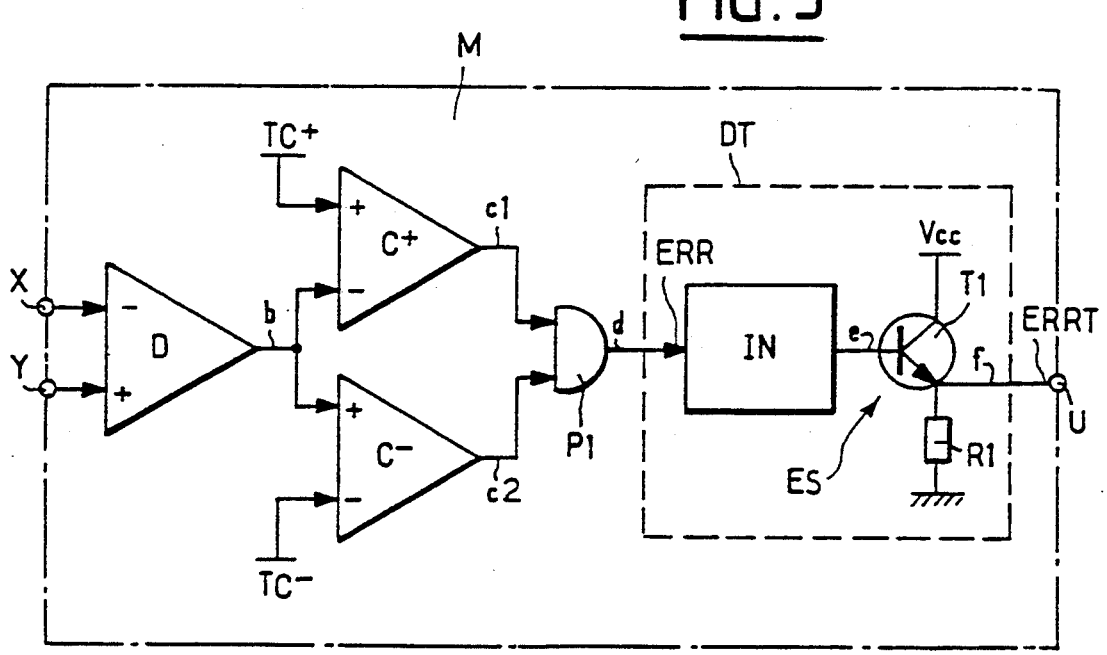
FIG. 5 illustrates an embodiment of said monitor with a delay timer, in electronic form.
Figure 6A:
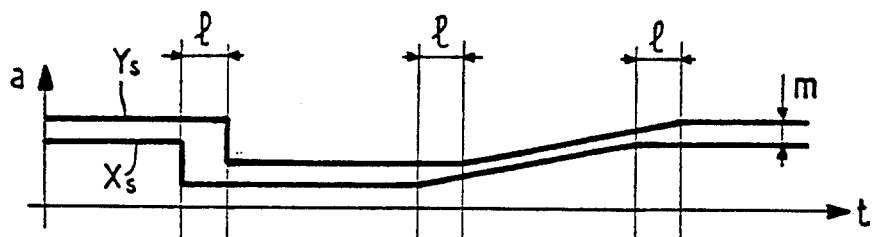
FIGS. 6a to 6f are signal delay timing diagrams allowing explanation of the operation of the monitor of FIG. 5.
Figure 6B:
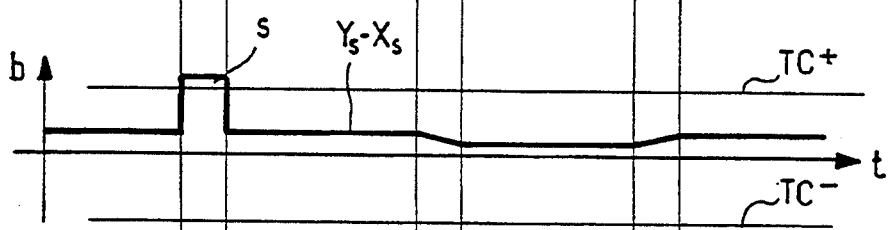
Figure 6C:
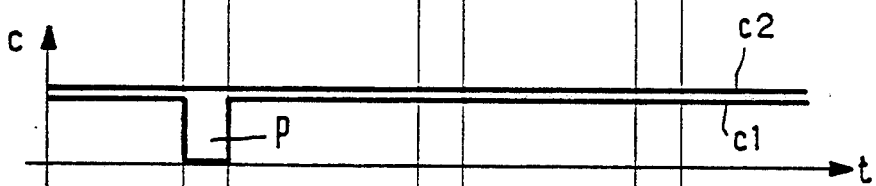
Figure 6D:
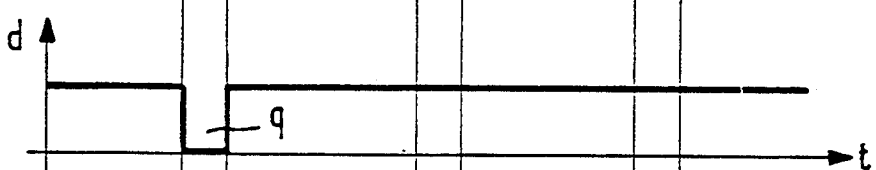
Figure 6E:
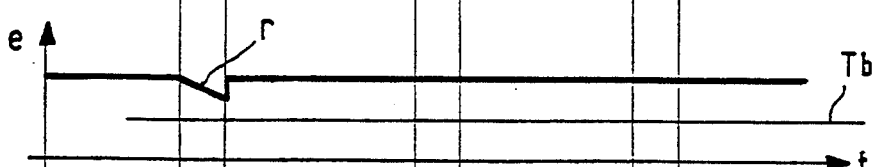
Figure 6F:
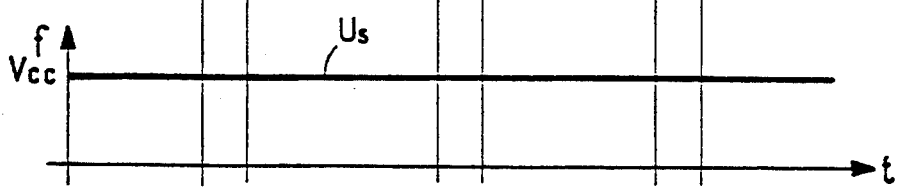

As was mentioned above, the selector FS can be used for input signals $E_s1$, $E_s2$ and $E_s3$ of various types. FIG. 5 represents an embodiment of the monitors M1 and M2 which is appropriate for analog electrical signals, with a threshold comparator C.

The monitor M of FIG. 5 comprises:
- a differential amplifier D playing the role of differentiator means D and whose inputs are connected respectively to the inputs X and Y of said monitor;
- a first comparator C+, whose positive input receives a voltage representative of a positive threshold TC+ and whose negative input is connected to the output of said differential amplifier D;
- a second comparator C−, whose positive input is connected to the output of said differential amplifier D and whose negative input receives a voltage representative of a negative threshold TC−;
- a logic gate P1, of AND type, whose inputs are connected respectively to the outputs of said first and second comparators C+ and C−;
- an integrator IN, whose input is connected to the output of the gate P1; and
- an output stage ES, comprising an interrupter transistor T1 whose base is connected to the output of the integrator IN, the collector to a supply voltage Vcc and the emitter to ground by way of a resistor R1 (the mounting of the transistor T1 represented is given merely by way of illustration of the latter's operation and does not necessarily correspond to the actual mounting employed.)

The output U of the monitor M is connected to the emitter of the transistor T1, in such a way that in the event of the cutting of the supply or the destruction of the transistor T1 in open circuit, the output U of the monitor M is at a voltage close to that of ground, which voltage may correspond to the low state B, and thus the associated diverter is in the quiescent state REP.

The first comparator C+ delivers a signal of constant amplitude (high state) at its output, when the signal which it receives from the differential amplifier D is less than the positive threshold TC+, and, in symmetrical fashion, the second comparator C− delivers a signal of constant amplitude (high state) at its output, when the signal which it receives from the differential amplifier D is greater than the negative threshold TC−, so that these two comparators C+ and C− simultaneously provide a high state at output if the signal arising from the differential amplifier D lies between the positive threshold TC+ and the negative threshold TC−, so that the logic gate P1 provides at output, in this case only, a high state.

To illustrate the operation of the monitor M of FIG. 5, reference is made below to the graphs of FIGS. $6a$ to $6f$, time t having been plotted on the X-axes.

The delay timing diagram of FIG. $6a$ gives an example of signals $X_s$ and $Y_s$, whose amplitude a is plotted on the Y-axis. It can be seen that the signals $X_s$ and $Y_s$ are similar, but that they are out of phase by l and shifted by m in amplitude. The delay timing diagram of FIG. $6b$ represents the signal $Y_s-X_s$, at the output of the differential amplifier D, the amplitude b of the signal $Y_s-X_s$ being plotted on the Y- axis. It can be seen that, for the major part thereof, the amplitude b of signal $Y_s-X_s$ lies between the thresholds TC+ and TC− of comparators C+ and C−, except as regards the portion s, which exceeds the positive threshold TC+. It results from this that, at their respective outputs, the comparator C+ delivers a signal of constant high amplitude c1, except in respect of the portion s where the high level of the signal c1 is interrupted (at p) and the comparator C− also delivers a signal of constant high amplitude c2 (FIG. $6c$). Subsequently, the signal d at the output of the gate P1 is constant and at the high level, except in respect of the interrupt p, where it has an interrupt q (FIG. $6d$). At the output of the integrator IN, the signal e is therefore constant and at the high level, except in respect of the interrupt q, where it exhibits a ramp r, corresponding to the slow unloading of said integrator IN. If, as illustrated in FIG. $6e$, the signal e and its ramp r are greater than the blocking threshold Tb of the transistor T1, the latter is conducting and the supply voltage Vcc is once again, for the major part, on the output U of the monitor M (see FIG. $6f$ in which the amplitude f of the signal $U_s$ is plotted on the Y-axis).

The delay timing diagram of FIG. $6f$ corresponds to the high state H, taken as being a voltage near Vcc, of the output U of the monitor M.

It will thus be understood that, if the amplitude b of the signal $Y_s-X_s$ leaves the corridor TC+, TC− (see FIG. $6b$) for a sufficiently long time, the ramp r of the signal e drops below the blocking threshold Tb of the transistor T1 (FIG. $6e$), so that the conduction of the latter is blocked and the signal f becomes zero. The output U of the monitor M is then in its low state B.

The tolerances on the detection parameters (TC+, TC−, $T_s$) must be sufficiently "wide" to preclude untimely disconnections, but must however be sufficiently "narrow" for a signal which is erroneous at output for the duration $T_s$ not to be problematic in respect of the system using said signal selector FS.

As far as the diverter AIG1 is concerned, it can be of the analog or digital signal switch type. It can thus include several switches in parallel, controlled identically, making it possible to transmit analog or digital signals. Thus, FIG. 7 represents a parallel diverter AIG with electric control, making it possible to switch signals coded over 8 bits. This diverter AIG can be constructed by using parallel multiplexer logic circuits or relays with quiescent/working position, or optical switches.

The signal selector FS, as described earlier, is able to mask an incorrect input signal. However, in the case of a double defect with these input signals, there is a risk of inducing an error in the downstream circuits. To alleviate this, the signal selector FS, as represented in FIG. 8, includes, additionally, circuits modifying its behavior and becomes a signal selector FS, with blocking.

This signal selector FS, with blocking, has the aim of alleviating two problems which are not resolved by means of the selectors FS described above:

- in the case where the signals $E_s1$ and $E_s3$ of a three-input selector FS are incorrect and different, this three-input signal selector FS is configured in such a way that its two output signals $S_s1$ and $S_s2$ are respectively identical to the two input signals $E_s1$ and $E_s3$, and, in the case of the construction of a signal selector with n inputs using such selectors FS mounted in cascade as explained further on, this illustrative case is problematic since, to tolerate this double fault (fault in $E_s1$ and $E_s3$), two other downstream stages are necessary, each formed by a three-input signal selector FS receiving a correct signal on their third input E3;
- the three-input signal selector FS can also be made defective in the event of a sequential fault in two input signals which took an identical incorrect value since the output signals $S_s1$ and $S_s2$ are then formed by the two input signals which are incorrect and identical, and hence undetectable, as incorrect signals, by a system placed downstream (for example a duplex system or quite simply by another three-input signal selector FS making it possible to constitute a signal selector with n inputs).

This signal selector FS, with blocking, comprises:

said first diverter AIG1 and second diverter AIG2 comprising respectively, additionally, a state output SE providing a signal representative of the active ACT or quiescent REP state of said diverter AIG1 or AIG2;

a detector means DET with two inputs D1, D2, connected respectively to the state output SE of the first diverter AIG1 and of the second diverter AIG2, which is able to provide, on its output Q, an item of information indicative of the presence of one at least of the first A1 and second diverters A2 in the quiescent state REP;

a first interlock means P1, interposed between the output U of said first monitor M1 and the control input EC of said second diverter AIG2, receiving, on a control input EP1, said item of information arising from the output Q of the detector means DET and enabling said first monitor M1 to control the state of said second diverter AIG2 if said detector means DET has not previously detected that at least one of said first diverter AIG1 and second diverter AIG2 is in its quiescent state REP, and preventing said first monitor M1 from controlling said second diverter AIG2 if said detector means DET has previously merely detected that at least one of said first diverter AIG1 and second diverter AIG2 is in its quiescent state REP;

a second interlock means P2, interposed between the output U of said second monitor M2 and the control input EC of said first diverter AIG1, receiving, on a control input EP2, said item of information arising from the output Q of the detector means DET and enabling said second monitor M2 to control the state of said first diverter AIG1 if said detector means DET has not previously detected that at least one of said first diverter AIG1 and second diverter AIG2 is in its quiescent state REP, and preventing said second monitor M2 from controlling said first diverter AIG1 if said detector means DET has previously detected that at least one of said first diverter AIG1 and second diverter AIG2 is in its quiescent state REP.

The signal selector FS, with blocking, thus alleviates the abovementioned problems by using an additional blocking mechanism, that is to say that in the first reconfiguration due to an incorrect input signal, this mechanism freezes this new configuration and thus prevents any new reconfiguration when a second input signal becomes incorrect.

Stated otherwise, in the event of a first fault in one of its three input signals $E_s1$, $E_s2$, $E_s3$, the signal selector FS, with blocking, is configured so that it isolates the faulty input and provides on its two outputs S1 and S2 the two independent and correct input signals, but also freezes its new configuration by blocking the state of the diverters AIG1 and AIG2. Therefore, in the event of a second fault in one of its three input signals $E_s1$, $E_s2$, $E_s3$, the signal selector FS, with blocking, being blocked, it follows that one and only one output signal $S_s1$ or $S_s2$ is affected by the second fault in one of the three input signals $E_s1$, $E_s2$ or $E_s3$.

Thus, this incorrect output signal can easily be detected and isolated by another (lone) three-input signal selector FS placed downstream, which thus receives, in the absence of any other defect, two correct signals. A signal selector with n inputs, formed by n-2 signal selectors FS in cascade will thus be tolerant to n-2 faults.

The detailed operation of the signal selector, with blocking, of FIG. 8 is described below, with reference to the chart of FIG. 9 which indicates the state of the outputs S1 and S2. This chart demonstrates the following cases:

1) The signal selector FS, with blocking, is not supplied by a power source. In this case, the diverters AIG1 and AIG2 are in the quiescent state REP, as represented in FIG. 8;

2) The three signals $E_s1$, $E_s2$ and $E_s3$ are correct (state 1 of FIG. 9). In this case, the monitors M1 and M2 respectively detect the identity of the signals $E_s1$ and $E_s2$ and that of the signals $E_s2$ and $E_s3$ and their outputs in the high state H respectively control the diverters AIG2 and AIG1 in the active state ACT. It follows that, on the common outputs SC of the diverters AIG1 and AIG2, output signals $S_s1$ and $S_s2$ appear respectively which are identical to one another and equal to the signal $E_s2$. This detector means DET receiving respectively, on its two inputs D1 and D2, the two signals arising respectively from the state output SE of the first diverter AIG1 and of the second diverter AIG2, which are indicative of the active ACT or quiescent REP state of these diverters. These detector means DET detects, in the present case, that neither diverter AIG1 or AIG2 is in its quiescent state REP, and it transmits, through its output Q, this item of information in the form of a control signal to the respective control inputs EP1 and EP2 of the first and second interlock means P1 and P2, respectively mounted in series between the output U of the monitor M1 or M2 and the input EC of the controlled diverter AIG2 or AIG1. These first and second interlock means P1 and P2 are able to transmit or not the signal received from the output U of the associated monitor M1 or M2, depending on the state of said control received on their control input EP1 and EP2; in the above case, the signal applied to the inputs EP1 and EP2 permits transmission of the signal $U_s$;

3) If (state 2 of FIG. 9) the signal $E_s1$ is incorrect, whereas the signals $E_s2$ and $E_s3$ are correct ( an incorrect signal being indicated by its name being underlined in this FIG. 9), the monitor M1, noting the difference in the signals $E_s1$ and $E_s2$, has its output U in the low state B, which forces the diverter AIG2 to be in the quiescent state REP, so that the signal $S_s2$ is equal to the signal $E_s3$. Furthermore, the monitor M2, noting the identity of the signals $E_s2$ and $E_s3$ and its output U being in the high state H, sends the diverter AIG1 to its active state ACT. The signal $S_s1$ is therefore equal to the signal $E_s2$; the detector means DET detects that the diverter AIG2 is in its quiescent state REP and transmits, through its output Q, this item of information to the first and second interlock means P1 and P2 which then block the possible subsequent controls arising from the outputs U of the monitors M1 and M2, and, thereby, freezes the selector FS in this state 2;

4) If (state 3 of FIG. 9) the signal $E_s2$ is incorrect, whereas the signals $E_s1$ and $E_s3$ are correct, it is seen that the outputs U of the monitors M1 and M2 are in the low state B and that the diverters AIG1 and AIG2 are in the quiescent state REP; the signals $S_s1$ and $S_s2$ are then equal to the signals $E_s1$ and $E_s3$ respectively; the detector means DET detects that the diverters AIG1 and AIG2 are in their quiescent state REP and transmits, through its output Q, this item of information to the first and second interlock means P1 and P2, which then block the possible subsequent controls arising from the outputs U of the monitors M1 and M2, and, thereby, freezes the selector FS in this state 3;

5) Similarly, if (state 4 of FIG. 9) the signal $E_s3$ is incorrect, whereas the signals $E_s1$ and $E_s2$ are correct, the outputs U of the monitors M1 and M2 are respectively in the high H and low B state and the diverters AIG1 and AIG2 are respectively in the quiescent REP and active ACT state, so that the signals $S_s1$ and $S_s2$ are respectively equal to the signals $E_s1$ and $E_s2$; the detector means DET detects that the diverter AIG1 is in its quiescent state REP and transmits, through its output Q, this item of information to the first and second interlock means P1 and P2, which then block the possible subsequent controls arising from the outputs U of the monitors M1 and M2, and, thereby, freezes the signal selector in this state 4;

6) If, after a first fault in one of the three signals $E_s1$, $E_s2$ or $E_s3$, as represented by the states 2, 3 or 4 of FIG. 9, a second input signal goes to an incorrect state, just one of these input signals is correct; it follows that one and only one output signal $S_s1$ or $S_s2$ is affected by the second fault in one of the three input signals $E_s1$, $E_s2$ or $E_s3$, as represented by the states 5, 6, 7, 8, 9 and 10 of FIG. 9, since the state of the signal selector FS has been frozen by the first and second interlock means P1 and P2 in the event of the first fault (cases 3, 4 or 5 cited earlier);

7) Finally, if the three input signals $E_s1$, $E_s2$ and $E_s3$ are incorrect, the two output signals $S_s1$ and $S_s2$ are formed by two signals which are incorrect, and different in the general case, this situation not being represented in FIG. 9.

Preferably, this three-input signal selector FS, with blocking, comprises, at the output of the monitors M1 and M2, a threshold comparator C and a delay timer DT, so as to preclude the detector means DET from memorizing a transition to the quiescent state REP of the diverter AIG1 or AIG2 which is only transient, following a slight discordance between two input signals.

According to an illustrative application of the three-input signal selector FS described earlier, a signal selector GS is constructed with n inputs I1 to In at two outputs S1 and S2 by forming a cascade of n-2 such three-input signal selectors FS which are identical to one another.

The variant of the three-input signal selector FS, with blocking, is the most appropriate. Other embodiments of selectors GS, not using selectors FS with blocking, are however possible. Therefore, the representation of the selector GS in the following figures is diagrammatic, and represents only its basic structure.

In the signal selector GS with n inputs, shown diagrammatically in FIG. 10, a plurality of n-2 three-input signal selectors FS is again found, with or without blocking, bearing respectively the references FS1, FS2, FS3, ..., FSi, ..., FSn-2. These three-input signal selectors FSi are mounted in cascade so as to form the signal selector GS with n inputs I1 to In and with two outputs, these latter two being those S1 and S2 of that three-input signal selector FSn-2 which is furthest downstream.

The inputs E1, E2, E3 of the first three-input signal selector FS1, situated furthest upstream, are respectively connected to the inputs I1, I2 and I3, whereas the outputs S1 and S2 of the first three-input signal selector FS1 are connected respectively to the inputs E1 and E2 of the second three-input signal selector FS2. The third input E3 of the second three-input signal selector FS2 is connected to the input I4. More generally, the inputs E1 and E2 of the three-input signal selector FSi of rank i in the cascade (where $1<i\leq n-2$) are connected respectively to the outputs S1 and S2 of the three-input signal selector FSi-1, of immediately lower rank, whereas the third input E3 of this three-input signal selector FSi is connected to the input Ii+2. If all the signals appearing at the inputs I1 to In are correct, the truth table of FIG. 2 demonstrates that the signals appearing at the outputs of the signal selector GS with n inputs of FIG. 10, that is to say on the outputs S1 and S2 of the three-input signal selector FSn-2, each consist of the signal $E_s2$ applied to the input I2.

The operation of a signal selector GS with n inputs, constructed from n-2 selectors FS without blocking in cascade, can easily be deduced from the operation of the three-input signal selector FS represented in FIG. 1, where each three-input signal selector (FS1, FS2, FS3, ..., FSi, ..., FSn-2) constituting said signal selector GS with n inputs is identical to that described earlier.

Indeed, it is seen in accordance with the truth table on FIG. 2, that each three-input signal selector FSi transmits two correct signals $S_s1$ and $S_s2$ while there is not more than one incorrect signal at input; each stage of this cascade mounting is thus able to eliminate a defect appearing in one of the n inputs. For example, if the set of signals I3 to In is incorrect, each of the n-2 three-input signal selectors FSi chooses the two correct signals which it receives, and eliminates the third which is incorrect.

By contrast, if at least two of the three signals I1, I2, I3 applied to the first three-input signal selector FS1 are incorrect, the outputs S1 and S2 of this first three-input signal selector FS1 provide the signals I1 and I3, that is to say one or two incorrect signals. In the case where I1 and I3 are both incorrect, the second three-input signal selector FS2 therefore receives these two incorrect signals I1 and I3 on its inputs E1 and E2, and the signal I4 on its input E3. It therefore provides, in accordance with the truth table of FIG. 2, the two signals received on its first E1 and third E3 input, that is to say I1, incorrect, and I4, correct a priori, on its respective outputs S1 and S2.

The third three-input signal selector FS3 then receives the signals I1, incorrect, I4, correct a priori, and I5, correct a priori. It will therefore transmit the signals I4 and I5; the incorrect signals I1 and I3 have thus been eliminated from the propagation chain. It is thus seen that the elimination of the incorrect signals is carried out by virtue of the insertion, into the propagation chain, of correct signals on the input E3 of the three-input signal selectors FSi, the second insertion of a correct signal being detected by comparison, this establishing a transmission of two correct signals.

According to an illustrative application of said signal selector GS with n inputs, a poller V1 with n inputs is constructed, represented in FIG. 11, comprising:

a signal selector GS with n inputs, as described earlier;

a first interrupter INT1 provided with an active input A and with a control input EC which is able to place, or not, said active input A in connection with a common output SC, depending on whether this first interrupter INT1 is respectively in the active state or in the quiescent state, as a function of the signal applied to said control input EC, said active input A and said common output SC of said first interrupter INT1 being respectively connected to said output S1 of said signal selector GS with n inputs and to the output S of said poller with n inputs, that is to say this first interrupter INT1 can have an active state for which its common output SC is connected to its active input A, and a quiescent state for which its output SC is not connected; it can have the same constitution as a diverter AIG1 which has no quiescent input R;

a first output monitor MS1, identical to said first and second monitors M1 and M2, whose two inputs X and Y are respectively connected to said outputs S1 and S2 of the signal selector GS with n inputs in order to measure the deviation between the signals appearing on these outputs S1 and S2, the output U of said first output monitor MS1 being connected to the control input EC of said first interrupter INT1 and being able to control the state of said first interrupter INT1.

Thus, said signal selector GS with n inputs, consisting of n-2 (where $n\geq 3$) three-input signal selectors FS in cascade, forms a first stage which automatically configures the n inputs into two intermediate signals $S_s1$ and $S_s2$, isolating any possible faulty input signals, this being favorable to operational reliability. Advantageously, the construction of this first stage, from n-2 signal selectors FSi, with blocking, in cascade, makes it possible to obtain a system masking a fault in n-2 input signals out of the n input signals arising from n redundant sub-systems, as well as that of the associated three-input signal selectors FSi which constitute the first stage. Furthermore, said first output monitor MS1 and said first interrupter INT1 form a second stage which compares the two intermediate signals $S_s1$ and $S_s2$ transmitted by the first stage, in order to detect an n-1th fault, so as to isolate the output of the poller with n inputs, the first interrupter INT1 then cutting the connection between its common output SC and said active input A if there is disagreement between said intermediate signals $S_s1$ and $S_s2$. The security of the system is thus increased. Upstream of the first stage of the poller V1 with n inputs there is a structure comprising an order n redundancy of sub-systems, a method of increasing the operational reliability of a system, whereas downstream of this first stage there is a duplex structure making it possible to monitor the coherence of the two output signals $S_s1$ and $S_s2$ from this first stage, by means of the second stage.

With the aim of simplifying the understanding of the operation of the poller V1 with n inputs, the explanation of its operation is made on the basis of a three-input poller V2 whose first stage consists of a single three-input signal selector FS.

Thus, the three-input poller V2, according to the present invention and shown in FIG. 12, comprises the three-input signal selector FS described earlier, whose inputs E1, E2, E3 form the three inputs of said three-input poller V2, which furthermore is provided with an output S. In addition to the selector FS, the three-input poller V2 comprises:

said first interrupter INT1, provided with an active input A, with a control input EC and with a common output SC, said active input A and said common output SC of said first interrupter INT1 being respectively connected to said common output SC of said first diverter AIG1 and to the output S of said three-input poller V2; and said first output monitor MS1 with two inputs X and Y connected respectively to said common outputs SC of said first and second diverters AIG1 and AIG2 and able to control, by way of its output U, the control input EC of the first interrupter INT1.

Just as for the monitors M1 and M2, the output U of the first output monitor MS1 can take a low state B or a high state H and send the first interrupter INT1 to the active state ACT, when this output is in its high state H, and send it to the quiescent state REP, when this output is in its low state B, which then isolates its output SC from its active input A.

The operation of the three-input poller V2 of FIG. 12 is described below, with reference to the truth table of FIG. 13, which includes that of FIG. 2. In this truth table, the output signal from this poller V2 is denoted by the reference $S_s$. The various cases which can occur are taken up again below:

1) Said three-input poller V2 is not supplied by a power source. In this case, the diverters AIG1 and AIG2 and the first interrupter INT1 are in the quiescent state REP, so that the output S is isolated from the inputs E1, E2, E3, as represented by FIG. 12;

2) The three signals $E_s1$, $E_s2$ and $E_s3$ are correct. It has been seen that the output signals $S_s1$ and $S_s2$ of the three-input signal selector FS are then equal to the signal $E_s2$. The first output monitor MS1 notes the equality of the signals $S_s1$ and $S_s2$, and its output U is in the high state H, and sets the interrupter INT1 to the active state ACT. The output signal $S_s$ is therefore equal to the signal $E_s2$;

3) The signal $E_s1$ is incorrect, whereas the signals $E_s2$ and $E_s3$ are correct. It has been seen that the output signal $S_s2$ is then equal to the signal $E_s3$ and that the output signal $S_s1$ is equal to the signal $E_s2$. It follows that the output signals $S_s1$ and $S_s2$ are identical and that the first interrupter INT1 is in the active state ACT under control of the output U of the first output monitor MS1. The output signal $S_s$ of the poller V2 is therefore equal to the signal $E_s2$;

4) If the signal $E_s2$ is incorrect, whereas the signals $E_s1$ and $E_s3$ are correct, it has been seen that the output signals $S_s1$ and $S_s2$ are equal respectively to the signals $E_s1$ and $E_s3$, so that the output U of the first output monitor MS1 is in the high state H and the first interrupter INT1 is in the active state ACT, the output signal $S_s$ from the poller V2 then being equal to the signal $E_s1$;

5) Similarly, if the signal $E_s3$ is incorrect, whereas the signals $E_s1$ and $E_s2$ are correct, it has been seen that the signals $S_s1$ and $S_s2$ are respectively formed by the signals $E_s1$ and $E_s2$, so that the output from the first output monitor MS1 is in the high state H and the interrupter INT1 is in the active state ACT, the output signal $S_s$ from the poller V2 then being equal to the signal $E_s1$;

6) If two of the signals $E_s1$, $E_s2$, $E_s3$ are incorrect and not identical, just one of them being correct, it has been seen that signals $S_s1$ and $S_s2$ are respectively equal to the different signals $E_s1$ and $E_s3$, so that the output U from the first output monitor MS1, in the low state B, sets the first interrupter INT1 to the quiescent state REP. The output S from the poller V2 is then isolated from the inputs E1, E2, E3; in the truth table of FIG. 13, the isolation of the output S is symbolized by the letter Z;

7) Finally, if the three signals $E_s1$, $E_s2$, $E_s3$ are incorrect, it has been seen that the signals $S_s1$ and $S_s2$ are respectively formed by the signals $E_s1$ and $E_s3$, which are not identical in general, so that the output S is isolated from the inputs E1, E2, E3.

As explained earlier, it is desirable to delay the output from the monitors M1 and M2, and also that from the first output monitor MS1, so as to preclude untimely switchings due to fleeting discordances, which are the more numerous the more inputs there are and which would cause the three-input signal selectors FSi, with blocking, to pass to the interlocked state. This delay timing may be done on just the first output monitor MS1, in so far as the downstream system using the signal arising from the poller V1 can tolerate brownouts in this signal, due to switchings in the first stage.

As indicated earlier, the first stage of the poller V2 with n inputs is tolerant to its n-2 faults. For the same to be true of the whole of this poller V2 with n inputs, it is advantageous to provide a duplication of the second stage, as illustrated in FIG. 14, which comprises:

m interrupters INTj (j an integer=1 to m), each provided with an active input A, with a control input EC and with a common output SC, said active input A and said common output SC of said m interrupters INTj being respectively connected to said output S1 of said signal selector GS with n inputs and to the output S of said poller with n inputs; and m output monitors MS1, ..., MSj, ..., MSm with two inputs X, Y, one, X, of two inputs of which is connected to one, S1, of the outputs of said signal selector GS with n inputs and the other, Y, of the two inputs of which is connected to the other, S2, of the outputs of said signal selector GS with n inputs, in order to measure the deviation between the signals $S_s1$ and $S_s2$ appearing on said outputs S1 and S2, and able to control, by way of their output Uj, the control input ECj of the associated interrupter INTj of like rank j.

Thus, the second stage of the poller with n inputs according to the invention comprises m identical output monitor MSj and interrupter INTj assemblies, mounted in parallel, making it possible to preclude the effects of m-1 failures in the quiescent state of the output monitor MSj and interrupter INTj assemblies.

In practice, the probability of a defect in an output monitor MSj and interrupter INTj assembly is small compared with the probability of defect of a selector of the input stage and of the associated sub-systems, because these sub-systems usually comprise numerous components. Therefore, a redundancy m of order less than n is sufficient, all the more since an excessive number m of output monitors MSj and interrupters INTj goes counter to security, since the presence of a single output monitor Mj and interrupter INTj at fault in the active state prevents the others from isolating the output S of the poller with n inputs relative to the outside world. For example, the second stage of the poller with n inputs can easily be constructed with m=2 output monitor MSj and interrupter INTj assemblies, mounted in parallel, thus making it possible to preclude the effects of a failure in the quiescent state of one of the two. The expert however knows series and parallel mountings of interrupters enabling a blocking in the active state ACT to be tolerated.

FIG. 15 shows, by way of example, an embodiment of a three-input poller V3 which is completely tolerant to a fault in the full system consisting of three redundant sub-systems (not shown), providing the signals applied to the inputs E1, E2 and E3, and of the poller V3.

It should be noted that the active inputs A of the interrupters INT1 and INT2 can be connected to one or the other of the outputs S1 or S2 of the signal selector GS, since the output S of the poller V3 transmits one of the two signals appearing on its outputs S1 or S2, when these signals are identical, and none when they are different.

Similarly, connecting the active input A of certain interrupters INTj to the output S1, and the active input A of the other interrupters INTj to the output S2 could be envisaged, this providing a redundant link making it possible to tolerate the cutting of the link going from the output S1 to the active inputs A of the interrupters INTj. This however supposes that two of the signals applied to the inputs E1 to E3 can be connected, at the level of the output S of the poller V3.

FIG. 16 shows an embodiment of such a poller V1 in electro-optical form V4. In this case, the two-channel diverters AIG1 and AIG2 are optical multiplexers with electric control, the interrupter INT1 possibly being of the same type, with a single input used, whereas the monitors M1, M2 and MS1 are of electric type, such as described earlier.

The optical inputs E1, E2 and E3 are respectively connected to the optical diverters AIG1 and AIG2 and to the interrupter INT1 by optical fibers 10, 11 and 12. In the optical fiber 10, supplying the quiescent input R of the diverter AIG1, there is provided an optical coupler 13 in a "Y" whose diverted branch controls a photoelectric cell 14 constituting the input X of the monitor M1. Similarly, in the optical fiber 12, connected to the quiescent input R of the diverter AIG2, there is provided an optical coupler 15 in a "Y" whose diverted branch controls a photoelectric cell 16 constituting the input Y of the monitor M2. The optical fiber 11, connected to the input E2, supplies an optical coupler 17 in a "Y", with two diverted branches which control photoelectric cells 18 and 19 respectively, forming respectively the inputs Y of the monitor M1 and X of the monitor M2. Moreover, the optical coupler 17 supplies optical energy to an optical coupler 20, which is connected to the active inputs A of the diverters AIG1 and AIG2 by optical fibers 21 and 22, respectively. The optical couplers 17 and 20 can consist of a single four-output component.

The output of the diverter AIG1 is connected to the active input A of the interrupter INT1 by an optical fiber 23, in which is mounted an optical coupler 24 in a "Y" whose diverted branch controls a photoelectric cell 25 constituting the input X of the first output monitor MS1. The output of the diverter AIG2 is connected to a photoelectric cell 26 by an optical fiber 27, said cell 26 forming the input Y of the first output monitor MS1.

The output S of this poller V4 is formed by an optical fiber 28 connected to the output SC of the interrupter INT1. The monitors M1, M2 and MS1 control respectively, by way of their output U, the control input EC of the diverters AIG2 and AIG1 and of the interrupter INT1.

It is possible to construct such an electro-optical poller V4 comprising several fibers in parallel, by duplicating the optical fibers, the couplers and electro-optical interfaces and by using optical interrupters and diverters capable of switching several fibers, for example quiescent/working electro-optical relays with several fibers at output, as diagrammatically shown in FIG. 7, or a combination of several such relays with a single output fiber. The interrupter INT1 can be constructed in the same way, with optical relays in the passing active state.

Such a poller V4 can clearly comprise the various add-ons of threshold, delay timing and blocking set out earlier.

It is readily noted that the operation of this electro-optical poller V4 is identical to that of the poller V1 described earlier.

FIG. 17 represents an embodiment of such a poller V1 in hydraulic (or again pneumatic) form V5 comprising a pressurized fluid source 30 applied to a package 31 comprising a supply input 32, which source can be replaced by three independent sources each supplying one monitor M1, M2, MS1, this enabling possible faults in supply to be taken into account.

It is easily understood that each of these monitors M1, M2, MS1, for a hydraulic construction, can consist, diagrammatically, of a slide valve 33 making the supply input 32 and the output U 34 of the monitor intercommunicate only when the slide valve is in the central position. This slide valve 33 is kept in this central position by virtue of two opposing springs 35 and 36 controlled by the two monitored signals $X_s$ and $Y_s$ which are applied to the inputs X and Y, labeled 37 and 38 respectively, this as long as the monitored signals $E_s1$, $E_s2$, $E_s3$ are correct, and is thrust from one side or the other, interrupting the communication between the supply input 32 and the output U 34 of the monitor M, once a difference shows up between the two of the signals $E_s1$, $E_s2$, $E_s3$ monitored by the relevant monitor M.

FIG. 18 presents diagrammatically an illustrative embodiment of a pneumatic monitor M1, M2, MS1, formed by a distributer M, consisting of a package 41, of an input supply orifice 42 and comprising a movable piston 43 moving in this package 41 and controlling the pressurizing of an output orifice 44, which piston is subject to the opposing action of two springs 45 and 46, as in the case of the earlier hydraulic monitor M, and controlled by the two monitored signals $X_s$ and $Y_s$ applied to the inputs X and Y, labeled 47 and 48 respectively. Depending on the respective values of the pressures of the signals $X_s$ and $Y_s$, the piston 43 sets in communication with one another the input supply orifice 42 of the package 41 receiving the pressure of the source 30 and the output orifice 44 of said package 31 constituting the output U of the monitor M, or else sets this output U 44 in communication with the atmosphere through the orifices 49 or 50.

Just as for an electronic embodiment, it is possible to create a threshold in the action of the monitor M, by having springs 45 and 46 which are not strongly compressed in the equilibrium state of the monitor M1, this requiring the provision of work to compress one of the springs 45 or 46, the other spring not compensating for the compressive effort through its own expansion.

Similarly, the action of the monitor M can be delayed by use, for example, of orifices of small diameter, only allowing a small throughput of fluid to pass.

Similarly again, the diverters may be blocked after a first reconfiguration resulting from the appearance of a first fault, this making it possible to recover the same operation as the poller with blocking.

Moreover, each two-channel diverter AIG1 and AIG2 consists of a distributor DIS represented in FIG. 19 formed of a package 51 comprising a control input orifice EC, labeled 52, and a movable piston 53 able to move in this package 51, under the action of the pressure transmitted by said control input EC 52 to which is opposed that of a spring 55. Depending on the value of the pressure of said signal EC, the piston 53 sets one or other of two signal input orifices 57 and 58 of the package 51 in communication with the output orifice 54, said signal input orifices 57 and 58 corresponding to the quiescent R and active A inputs respectively.

The hydraulic and pneumatic diverters AIG and interrupters INT described above can be rendered able to switch several signals in parallel, by duplicating the elements required for each signal.

Here again, it is easily noted that the operation of the poller V5 of FIG. 17 is similar to that of the poller V1 described earlier.

We claim:

1. A signal selector (FS) comprising a first input (E1), a second input (E2) and a third input (E3) which are able to receive respectively a first signal ($E_s1$), a second signal ($E_s2$) and a third signal ($E_s3$) and comprising a first output (S1) and a second output (S2), which comprises:

a first two-channel diverter (AIG1) provided with an active input (A), with a quiescent input (R), and with a control input (EC) which is able to receive a control signal which sets, depending on its state, said first diverter (AIG1) to an active state (ACT) or to a quiescent state (REP), and with a common output (SC), said quiescent input (R) and said active input (A) of said first diverter (AIG1) being respectively connected to said first input (E1) and second input (E2) of said signal selector (FS), whereas said common output (SC) of said first diverter (AIG1) is connected to said first output (S1) of the signal selector (FS), this common output (SC) transmitting the signal applied to the active input (A) when said first diverter (AIG1) is in the active state (ACT), and transmitting the signal applied to the quiescent input (R) when said first diverter (AIG1) is in the quiescent state (REP);

a second two-channel diverter (AIG2) provided with an active input (A), with a quiescent input (R), and with a control input (EC) which is able to receive a control signal which sets, depending on its state, said diverter (AIG2) to an active state (ACT) or to a quiescent state (REP), and with a common output (SC), said active input (A) and said quiescent input (R) of said second diverter (AIG2) being respectively connected to said second input (E2) and third input (E3) of said signal selector (FS), whereas said common output (SC) of said second diverter (AIG2) is connected to said second output (S2) of the signal selector (FS), this common output (SC) transmitting the signal applied to the active input (A) when said second diverter (AIG2) is in the active state (ACT), and transmitting the signal applied to the quiescent input (R) when said second diverter (AIG2) is in the quiescent state (REP);

a first monitor (M1) with two inputs (X, Y), connected respectively to said first input (E1) and second input (E2) of said signal selector (FS), which is able to measure the deviation between said first signal ($E_s1$) and second signal ($E_s2$) and whose output (U) is connected to the control input (EC) of said second diverter (AIG2) and is able to control the state of this second diverter (AIG2); and a second monitor (M2) with two inputs (X, Y), connected respectively to said second input (E2) and third input (E3) of said signal selector (FS), which is able to measure the deviation between said second signal ($E_s2$) and third signal ($E_s3$) and whose output (U) is connected to the control input (EC) of said first diverter (AIG1) and is able to control the state of this first diverter (AIG1).

2. The signal selector (FS) as claimed in claim 1, in which said monitors (M) are of the type able to process analog or digital, serial or parallel signals, wherein each of said monitors (M) comprises:

differentiator means (D) for measuring the difference between the signals applied to the inputs (X, Y) of said monitor (M);

comparator means (C) for comparing said difference with a predetermined threshold (TC+, TC−) and for generating an error signal if the absolute value of said difference is greater than the absolute value of said threshold (TC+, TC−).

3. The signal selector (FS) as claimed in claim 1, wherein delay timer means (DT) are interposed in series with the output (U) of at least one monitor (M).

4. The signal selector (FS) as claimed in claim 1, wherein each two-channel diverter (AIG) is an electric switching device consisting of several identical electrical switches arranged in parallel.

5. The signal selector (FS) as claimed in claim 1, wherein each two-channel diverter (AIG) is an optical switching device with electric control consisting of several identical optical switches arranged in parallel.

6. The signal selector (FS) as claimed in claim 1, wherein each two-channel diverter (AIG) is a hydraulic or pneumatic switching device consisting of several identical hydraulic or pneumatic switches arranged in parallel.

7. The signal selector (FS) as claimed in claim 6, wherein said monitors (M) are able to process fluid pressure signals, wherein each of said monitors (M) comprises a member (43) subject to the opposing action of the signals appearing in the signal inputs (X, Y) of said monitor (M) and controlling the passage of fluid between a pressure source (30) and the output (U) of said monitor (M).

8. The signal selector (FS) as claimed in claim 6, wherein each of said diverters (AIG) comprises a member (53), subject to the action of the signal applied to the control input (EC) of said diverter (AIG), said member (53) being able to place one or the other of two signal input orifices (57, 58) in communication with an output orifice (54).

9. The signal selector (FS) as claimed in claim 1, wherein:
the first diverter (AIG1) and second diverter (AIG2) comprise respectively, additionally, a state output (SE) providing a signal representative of the active (ACT) or quiescent (REP) state of said diverter (AIG1, AIG2);
and wherein it comprises:
a detector means (DET) with two inputs (D1, D2), connected respectively to the state output (SE) of the first diverter (AIG1) and of the second diverter (AIG2), which is able to provide, on its output (Q), an item of information indicative of the presence of one at least of the first diverter (AIG1) and second diverter (AIG2) in the quiescent state (REP);
a first interlock means (P1), interposed between the output (U) of said first monitor (M1) and the control input (EC) of said second diverter (AIG2), receiving, on a control input (EP1), said item of information arising from the output (Q) of the detector means (DET) and enabling said first monitor (M1) to control the state of said second diverter (AIG2) if said detector means (DET) has not previously detected that at least one of said first diverter (AIG1) and second diverter (AIG2) is in its quiescent state (REP), and, in the other case, preventing said first monitor (M1) from controlling said second diverter (AIG2);
a second interlock means (P2), interposed between the output (U) of said second monitor (M2) and the control input (EC) of said first diverter (AIG1), receiving, on a control input (EP2), said item of information arising from the output (Q) of the detector means (DET) and enabling said second monitor (M2) to control the state of said first diverter (AIG1) if said detector means (DET) has not previously detected that at least one of said first diverter (AIG1) and second diverter (AIG2) is in its quiescent state (REP), and, in the other case, preventing said second monitor (M2) from controlling said first diverter (AIGl).

10. A signal selector (GS) having a plurality of n inputs (I1 to In) and two outputs (S1, S2), comprising a plurality of n-2 signal selectors (FS1 to FSn-2) with three inputs (where n is an integer $\geq 3$), as claimed in claim 1, wherein said three-input signal selectors (FS1 to FSn-2) are respectively mounted in cascade, the three inputs (E1, E2, E3) of the first three-input signal selector (FS1) being respectively connected to three (I1, I2, I3) of said n inputs (I1 to In), whereas, for each of the (n-3) other three-input signal selectors (FSi) of rank i (where $1 < i \leq n-2$), two of its inputs (E1, E2) are connected respectively to the outputs (S1, S2) of the upstream three-input signal selector (FSi-1) of rank i-1, the third (E3) of said inputs of the three-input signal selector (FSi) of rank i being connected inherently to one of said n inputs (I1 to In) of said signal selector (GS) with n inputs, whereas the outputs (S1, S2) of that signal selector (FSn-2) which is furthest downstream are connected respectively to the outputs (S1, S2) of said signal selector (GS) with n inputs.

11. A poller (V) with n inputs (I1, I2, I3, ..., Ii, ..., In) and one output (S), comprising a signal selector (GS) with n inputs, as defined in claim 10, comprises:
a first interrupter (INT1) provided with an active input (A) and with a control input (EC) which is able to place, or not, said active input (A) in connection with a common output (SC), depending on whether this first interrupter (INT1) is respectively in the active state or in the quiescent state, as a function of the signal applied to said control input (EC), said active input (A) and said common output (SC) of said first interrupter (INT1) being respectively connected to one of said outputs (S1, S2) of the signal selector (GS) with n inputs and to the output (S) of said poller with n inputs; and
a first output monitor (MS1), with two inputs (X,Y), as defined in claims 1 to 10, which two inputs (X, Y) are respectively connected to said outputs (S1 and S2) of the signal selector (GS) with n inputs and are able to measure the deviation between the signals ($S_s1$, $S_s2$) appearing on said outputs (S1, S2) of the signal selector (GS) with n inputs, and whose output (U) is connected to the control input (EC) of said first interrupter (INT1) and is able to control the state of said first interrupter (INT1).

12. The poller (V) with n inputs as claimed in claim 11, which comprises:
m interrupters (INTj) (where j is an integer = 1 to m) as defined in claim 11, said active input (A) and common output (SC) of each of said m interrupters (INTj) being connected respectively to one of said outputs (S1, S2) of said signal selector (GS) with n inputs and to the output (S) of said poller (V) with n inputs; and
m output monitors (Msj) with two inputs (Xj, Yj), one (Xj) of the two inputs of which is connected to one (S1) of the outputs of said signal selector (GS) with n inputs and the other (Yj) of the two inputs of which is connected to the other (S2) of the outputs of said signal selector (GS) with n inputs, which are able to measure the deviation between the signals ($S_s1$, $S_s2$) appearing on said outputs (S1, S2) of said signal selector (GS) with n inputs, and whose output (Uj) is connected inherently to the control input (ECj) of one of said m interrupters (INTj), of like rank j, and is able to control the state of said interrupter (INTj).

* * * * *